(12) United States Patent
Liu et al.

(10) Patent No.: US 10,290,642 B2
(45) Date of Patent: May 14, 2019

(54) FLASH MEMORY DEVICES INCORPORATING A POLYDIELECTRIC LAYER

(71) Applicant: Intel Corporation, Santa Clara, CA (US)

(72) Inventors: Haitao Liu, Meridian, ID (US); Guangyu Huang, Boise, ID (US); Krishna K. Parat, Palo Alto, CA (US); Shrotri B. Kunal, Boise, ID (US); Srikant Jayanti, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,771

(22) Filed: Sep. 30, 2017

(65) Prior Publication Data

US 2019/0103411 A1    Apr. 4, 2019

(51) Int. Cl.
| | | |
|---|---|---|
| *H01L 27/115* | (2017.01) | |
| *H01L 27/11524* | (2017.01) | |
| *H01L 27/1157* | (2017.01) | |
| *H01L 27/11556* | (2017.01) | |
| *H01L 29/51* | (2006.01) | |
| *H01L 27/11582* | (2017.01) | |
| *G11C 11/56* | (2006.01) | |

(52) U.S. Cl.
CPC .... *H01L 27/11524* (2013.01); *H01L 27/1157* (2013.01); *H01L 27/11556* (2013.01); *H01L 27/11582* (2013.01); *H01L 29/517* (2013.01); *H01L 29/518* (2013.01); *G11C 11/5635* (2013.01); *G11C 11/5671* (2013.01)

(58) Field of Classification Search
CPC ............. H01L 27/115; H01L 27/11524; H01L 27/11556; H01L 27/1157; H01L 27/11582
See application file for complete search history.

(56) References Cited

U.S. PATENT DOCUMENTS

| | | | |
|---|---|---|---|
| 2010/0067301 A1* | 3/2010 | Kim | G11C 16/10 365/185.18 |
| 2010/0072535 A1* | 3/2010 | Takashima | H01L 27/11568 257/324 |
| 2011/0147827 A1 | 6/2011 | Simsek-Ege et al. | |
| 2014/0264527 A1* | 9/2014 | Koval | H01L 29/66666 257/315 |
| 2016/0071948 A1* | 3/2016 | Toratani | H01L 29/517 257/316 |
| 2016/0172366 A1 | 6/2016 | Koka et al. | |
| 2016/0211250 A1* | 7/2016 | Langheinrich | H01L 27/11534 |
| 2017/0092651 A1 | 3/2017 | Kim et al. | |
| 2017/0098659 A1* | 4/2017 | Yoshimizu | H01L 27/11582 |
| 2017/0373086 A1* | 12/2017 | Pang | H01L 29/66833 |
| 2018/0033798 A1* | 2/2018 | Baraskar | H01L 27/11582 |

OTHER PUBLICATIONS

International Search Report dated Feb. 26, 2019, in International Application No. PCT/US2018/048951, filed Aug. 30, 2018; 6 pages.

* cited by examiner

*Primary Examiner* — Phuc Dang
(74) *Attorney, Agent, or Firm* — Thorpe North & Western, LLP; David W. Osborne (57) ABSTRACT

Flash memory technology is disclosed. In one example, a flash memory cell can include a charge storage structure, a control gate laterally separated from the charge storage structure, and at least four dielectric layers disposed between the control gate and the charge storage structure. Associated systems and methods are also disclosed.

20 Claims, 5 Drawing Sheets

FLASH MEMORY DEVICES INCORPORATING A POLYDIELECTRIC LAYER

TECHNICAL FIELD

Embodiments described herein relate generally to computer memory, and more particularly to flash memory devices.

BACKGROUND

Flash memory is a type of computer memory that utilizes floating gate transistors such as metal-oxide-semiconductor field-effect transistors, as memory cells to store information. Principle among commercialized flash memory are NAND and NOR memory types. In NAND memory the cells are arranged in an array such that a control gate of each memory cell in a row is connected to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein.

Reference will now be made to the exemplary embodiments illustrated, and specific language will be used herein to describe the same. It will nevertheless be understood that no limitation of the disclosure scope or to specific invention embodiments is thereby intended.

DESCRIPTION OF EMBODIMENTS

Before technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes express support for a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures or elements are in physical contact with one another. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

Data density of flash memory devices can be increased by increasing the number of bits of information stored per memory cell. For example, a single-level cell (SLC) stores only one bit per memory cell, a so-called multi-level cell (MLC) stores two bits per memory cell, a triple level cell (TLC) stores three bits per memory cell, a quad level cell (QLC) stores four bits per memory cell, and so forth. One drawback of increasing data density, however, is the increased number of voltage states needed to store the information. For example, SLC requires only two voltage states, while MLC requires four voltage states, TLC requires eight voltage states, and QLC requires 16 voltage states to store the number of bits of information required per cell. Increasing data density in this manner therefore reduces the amount of margin separating the voltage states and increases the possibility of errors.

As data density increases, it is desirable to increase the program-erase-windows (PEW) to reduce or otherwise minimize the possibility for errors. The PEW is limited by the programming saturation voltage threshold. The interpoly dielectric (IPD) material between the charge storage structure and the control gate can be designed to control electron "leakage", which is a significant factor in limiting programming saturation voltage threshold. A typical IPD configuration utilizes no more than three dielectric layers in an oxide-nitride-oxide (ONO) configuration. Although this IPD configuration has been adequate for lower data densities, it has failed to yield the desired results for increased data density, such as for QLC and higher.

Accordingly, flash memory cells and structures are disclosed that provide increased data density capacity by modifying the IPD layer structure, which can be engineered to provide an energy band that decreases IPD electron leakage and therefore increases programming saturation voltage threshold and the PEW. One exemplary mechanism by which cell performance can be improved is by increasing the number of IPD layers, such as including four or more IPD layers. In one example, a flash memory cell can include a charge storage structure, a control gate laterally separated from the charge storage structure, and at least four dielectric layers disposed between the control gate and the charge storage structure. Associated devices, systems and methods are also disclosed.

Figure 1:
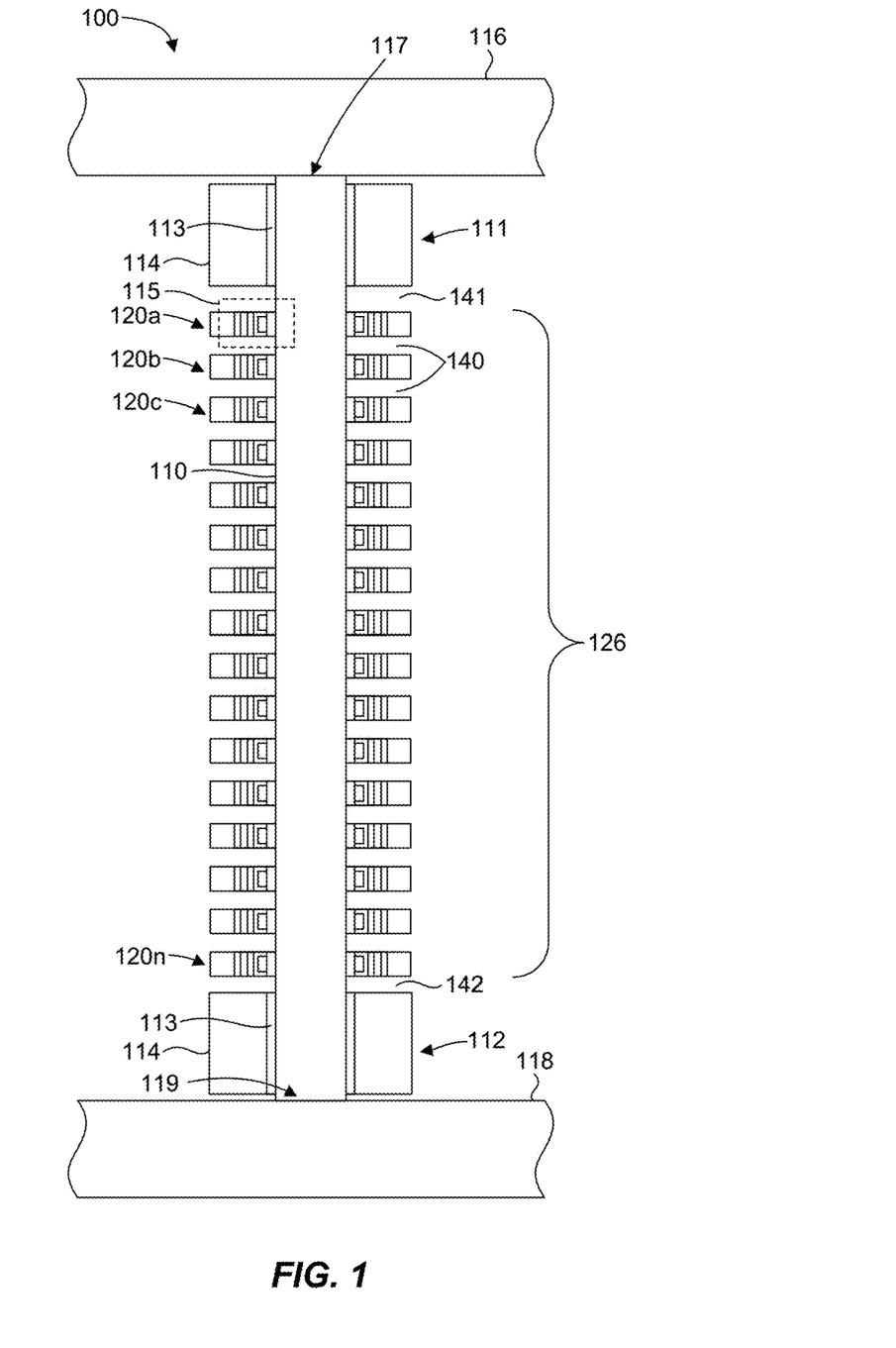
FIG. 1 illustrates a portion of a NAND memory device in accordance with an example embodiment.

Referring to FIG. 1, a portion of a flash memory device 100 is illustrated. This figure shows a cross-section of the flash memory device with a vertically oriented cut plane to show various features and geometries of the flash memory device 100 in vertical cross-section. In general, the portion of the flash memory device includes a memory pillar or conductive channel 110 and memory cells 120a-n (i.e., a string 126 of memory cells, such as a NAND string) located adjacent to the conductive channel 110. Any suitable number of memory cells can be included. The conductive channel 110 can be made of any suitable material (e.g., polysilicon, germanium (e.g., Ge or SiGe), SiC, a high band gap and high mobility material (e.g., ZnO, indium gallium zinc oxide (IGZO), GaP), etc.) such that the conductive channel can act as a channel region for the memory cells 120a-n, which can be coupled in series. For example, during operation of one or more of the memory cells 120a-n of the string, an electrical channel can be formed in the conductive channel 110. In some embodiments, the conductive channel 110 can have a hollow interior that is filled with an insulative material 115, such as an oxide material. The conductive channel 110 and the string of memory cells 120a-n can be oriented vertically, such as in a three-dimensional memory array. For example, memory cell 120a is located at a vertical level (e.g., near the top of the memory array) that is above a vertical level (e.g., near the bottom of the memory array) at which memory cell 120n is located. Typically, the conductive channel 110 will have a generally cylindrical configuration and the structures of each memory cell 120a-n will be disposed in concentric ring-like structures radially outward from the conductive channel.

Each memory cell 120a-n in this example may be a non-volatile memory cell and may have a charge-storage structure, such as a floating gate that may be a conductor (e.g., polysilicon), a charge trap that may be a dielectric, etc. Non-limiting examples of conductive or semi-conductive material that are suitable for a floating gate include polysilicon, silicated or non-silicated metal such as Ru, Pt, Ge, etc., with metals being either continuous or discontinuous. Non-limiting examples of dielectrics that are suitable for charge traps include nitrides, a silicon rich dielectric, or SiON/Si$_3$N$_4$. A tunnel dielectric for a charge trap-based device can be of multiple layers (e.g., oxide/nitride/oxide (O/N/O)) instead of a single dielectric layer, which is typical of floating gate tunnel dielectrics.

Figure 2:
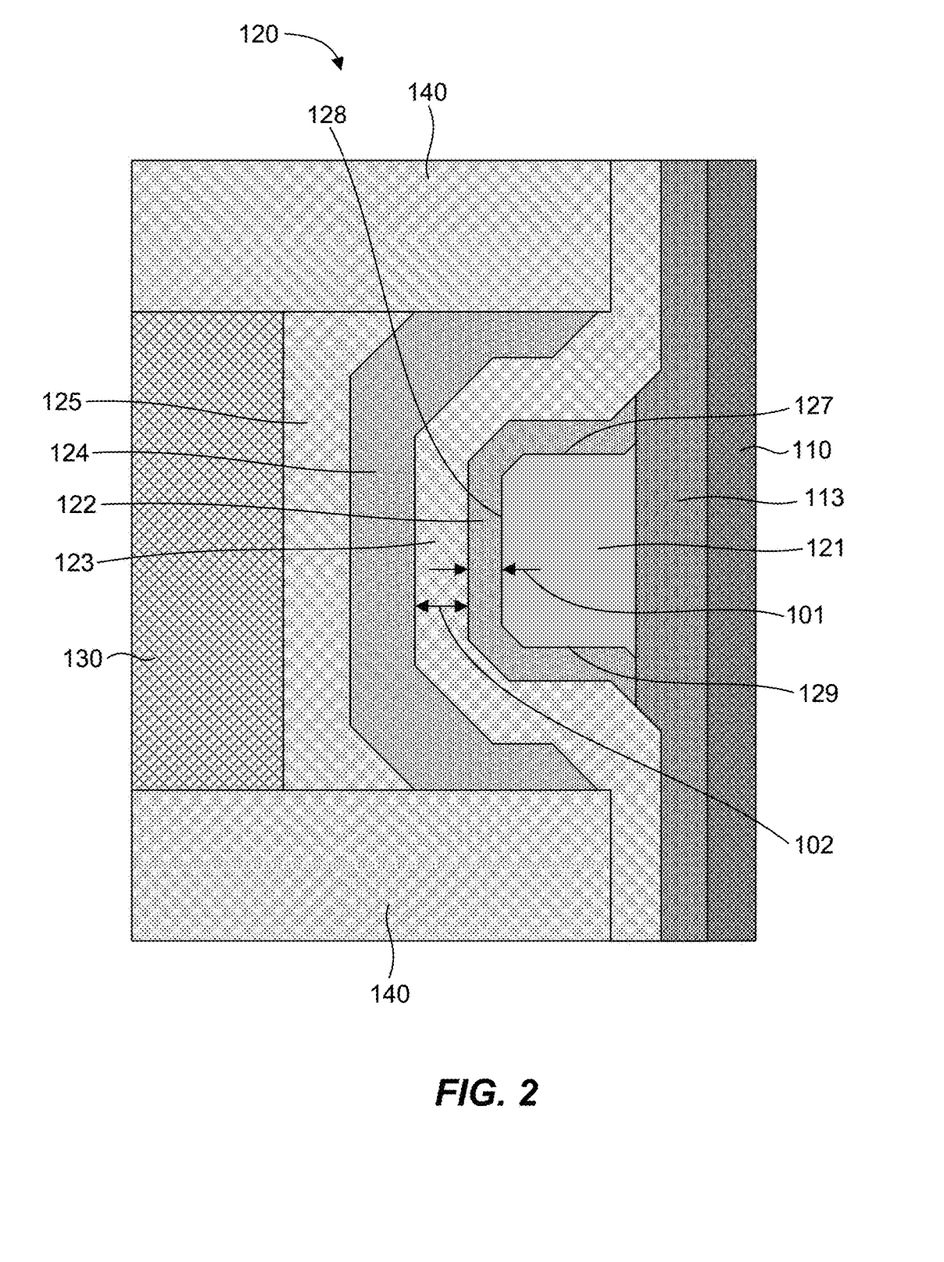
FIG. 2 illustrates a detailed view of a portion of a conductive channel and a memory cell of the NAND memory device of FIG. 1.

As shown in FIG. 2, which illustrates a detail view of a portion the conductive channel 110 and a portion of a representative memory cell 120 (region identified at 115 in FIG. 1), the memory cell 120 can have a charge-storage structure 121. Each memory cell 120a-n may be a non-volatile memory cell (e.g. floating gate MOSFET, charge trap, etc.). The charge-storage structure 121 can be floating gates that may be any suitable material (e.g., polysilicon, SiN, silicated metal, etc.) having any suitable property (e.g., electrical conductivity and charge capture/store/isolation). Each memory cell 120a-n can also have a tunnel dielectric layer interposed between its charge-storage structure and the conductive channel 110. For example, the memory cell 120 can have a tunnel dielectric layer 113 interposed between the charge-storage structure 121 and the conductive channel 110. The tunnel dielectric layers between the charge-storage structures and the conductive channels can comprise any suitable dielectric material. For example, the tunnel dielectric layer 113 can comprise an oxide material (e.g., silicon oxide), ONO (oxide/nitride/oxide), etc. In addition, each memory cell 120a-n can have a control gate (e.g., as a portion of, or coupled to access lines, such as word lines) laterally separated from the charge storage structure. For example, the memory cell 120 can include a control gate 130 laterally separated from the charge storage structure 121 such that the charge storage structure 121 is between the control gate 130 and the conductive channel 110. The control gate 130a can comprise any suitable conductive or semi-conductive material. For example, the control gate 130 can comprise polysilicon (e.g., doped, or undoped), tungsten or other metals, etc.

Each memory cell 120a-n can have at least four dielectric materials or dielectric layers (i.e., interpoly dielectric layers) interposed between its charge-storage structure and the control gate, which may serve as blocking dielectrics. For example, the memory cell 120 can include dielectric layers 122-125 interposed between the charge-storage structure 121 and the control gate 130. The dielectric layers between the charge-storage structures and the control gates can comprise any suitable dielectric material and two or more of the dielectric layers may have the same or different material composition. For example, the dielectric layer 122 adjacent to the charge storage structure 121 can comprise a nitride material (e.g., silicon nitride), an oxide material (e.g., aluminum oxide), a high dielectric constant material (e.g., HfOx, HfAlOx, AlOx, and ZrOx,). The dielectric layer 123 can comprise an oxide material (e.g., silicon oxide), an oxynitride material (e.g., silicon oxynitride), a high dielectric constant material (e.g., HfSiOx, HfOx, AlOx, and ZrOx), etc. The dielectric layer 124 can comprise a nitride material (e.g., silicon nitride), an oxide material (e.g., silicon oxide), etc. The dielectric layer 125 can comprise an oxide material (e.g., silicon oxide), an oxynitride material (e.g., silicon oxynitride), a high dielectric constant material (e.g., HfSiOx, HfOx, AlOx, and ZrOx), etc. In some embodiments, the dielectric layers 123-125 can include alternating layers of oxide material (e.g., silicon oxide) and nitride material (e.g., silicon nitride), thus being configured as ONO (oxide/nitride/oxide) in successive layers 123-125. With the dielectric layer 122, the dielectric layers 122-125 can be configured as NONO (nitride/oxide/nitride/oxide) or as AONO (AlOx/oxide/nitride/oxide) in successive layers 122-125.

With further reference to FIGS. 1 and 2, insulative layers or spacers 140 (e.g., a dielectric such as an oxide material (e.g., silicon oxide), an oxynitride material (e.g., silicon oxynitride), a nitride material (e.g., silicon nitride), etc.) may be vertically spaced apart from one another interposed between the memory cells 120a-n in the string 126. The conductive channel 110 can extend vertically along (e.g., through) the insulative layers 140 and the charge storage structures of the memory cells 120a-n can be disposed at least partially between adjacent insulative layers 140.

A dielectric 141 may be interposed between an end (e.g., between memory cell 120a) of the string 126 and the select gate 111, and a dielectric 142 may be interposed between an opposite end (e.g., between memory cell 120n) of the string 126 and the select gate 112, as shown in FIG. 1. Each memory cell 120a-n of the string 126 can be coupled in series with and can be between a select gate (e.g., a drain select gate) 111 adjacent to (e.g., in contact with) the conductive channel 110 and a select gate (e.g., a source select gate) 112 adjacent to (e.g., in contact with) the conductive channel 110. The conductive channel 110 is electrically coupled to a data line (e.g., a bit line 116), indicated at 117. Thus, the select gate 111 can selectively couple the string 126 to the data line (e.g., the bit line 116). In addition, the conductive channel 110 is electrically coupled to a source line 118, indicated at 119. Thus, the select gate 112 can selectively couple the string 126 to the source line 118. For example, the select gate 111 can be coupled in series with memory cell 120a, and the select gate 112 can be coupled in series with memory cell 120n. The select gates 111 and 112 can each include a gate dielectric 113 adjacent to (e.g., in contact with) conductive channel 110 and a control gate 114 adjacent to (e.g., in contact with) a corresponding gate dielectric 113.

Certain features of the memory cells 120a-120n can be configured to provide performance benefits. The size, geometry, and relationships of various memory cell components are described with reference to FIG. 2. As a schematic representation, FIG. 2 does not necessarily depict certain features as they would be found in an actual memory cell. For example, straight lines shown in the figure may not be exactly straight, and sharp corners may be rounded. Thus, there is some leeway when characterizing a shape of the cell geometry.

In one aspect, the inclusion of four or more dielectric layers 122-125 can be configured to improve the performance of the memory cell 120. For example, the energy band of the dielectric layers 122-125 can be engineered such that charge leakage through the dielectric layers 122-125 is significantly reduced (e.g., by orders of magnitude) compared to typical dielectric layer configurations that include three or fewer layers, which can result in higher program saturation voltages than is currently achievable and therefore increase the PEW. Furthermore, at cell erase state, the dielectric layer 122 can eliminate the charge gain from the dielectric layer 124.

In one aspect, a thickness 101 of the dielectric layer 122 adjacent to the charge storage structure 121 can be configured to provide performance benefits. The dielectric layer 122 can have any suitable thickness 101. In some embodiments, the thickness 101 of the dielectric layer 122 can be from about 1 nm to about 5 nm, which can be "tuned" to engineer the energy band of the dielectric layers 122-125. In one aspect, the dielectric layer 122 can be relatively thin compared to the other dielectric layers 123-125. For example, a ratio of the thickness 101 of the dielectric layer 122 to a thickness of any of the dielectric layers 123-125 (e.g., a thickness 102 of the dielectric layer 123 in one embodiment) can be from about 1:2 to about 1:5. The relative thicknesses of the dielectric layer 122-125 can be configured to engineer the energy band of the dielectric layers.

In one aspect, one or more of the dielectric layers 122-125 and/or the charge storage structure 121 can be configured to have a particular shape or geometry. For example, in some embodiments, the dielectric layer 122 and the charge storage structure 121 can be configured such that the dielectric layer 122 is adjacent to at least portions of three sides 127-129 of the charge storage structure 121. In this case, at least portions of the dielectric layer 122 adjacent the sides 127 and 129 of the charge storage structure 121 can be disposed between the charge storage structure 121 and the spaced apart insulative layers 140. This configuration of the dielectric layer 122 and the charge storage structure 121 can reduce charge leakage and therefore provide increased program saturation voltage.

The inclusion of four or more dielectric layers 122-125, the thickness 101 of the dielectric layer 122 adjacent to the charge storage structure 121, and/or the relationship of the dielectric layer 122 and the charge storage structure 121 can therefore be configured to improve the performance of the memory cell 120 as compared to currently known or traditional memory cells with no more than three IPD layers. Minimizing or controlling charge leakage, such as by engineering the energy band of the dielectric layers 122-125, can provide suitable program saturation voltages for a given memory cell design. For example, the dielectric layers 122-125 can be configured to provide a band gap that is sufficient for operation of a QLC. In other words, the dielectric layers 122-125 can be configured to provide a PEW that is sufficient for operation of a QLC.

Figure 3A:
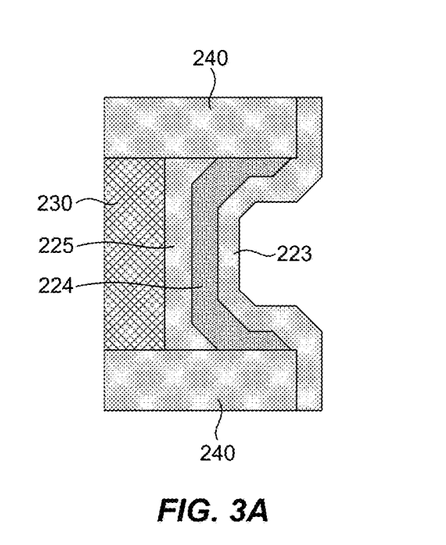
FIGS. 3A-3D illustrate methods for making a flash memory cell in accordance with an example embodiment.

FIGS. 3A-3D illustrate aspects of exemplary methods or processes for making a flash memory cell for inclusion in a flash memory component or device as disclosed herein. FIG. 3A schematically illustrates a side cross-sectional view of a control gate 230 between vertically spaced apart insulative layers 240. Three dielectric layers 223-225 are formed adjacent one another between the insulative layers 240, with the dielectric layer 225 being adjacent to the control gate 230. This structure can be formed by any suitable process or technique known in the art. For example, the control gate 230 geometry can be formed by removing conductive material between the insulative layers 240, such as by utilizing wet and/or dry cutting (e.g., etching) processes. The dielectric layers 223-225 can be formed on the control gate 230 in the recess or void between the insulative layers 240 utilizing deposition and oxidation processes. Any suitable oxidation and/or deposition process can be utilized. Wet and/or dry cutting (e.g., etching) processes may also be utilized to achieve a desired shape or geometry of the dielectric layers 223-225. For example, material may be deposited, oxidized (e.g., grown), and at least partially removed to form the dielectric layers 223-225. In one embodiment, material may be deposited and oxidized to form an oxide layer 225 (e.g., silicon oxide), material may be deposited to form a nitride layer 224 (e.g., silicon nitride), and material may be deposited and oxidized to form an oxide layer 223 (e.g., silicon oxide). Thus, alternating layers of oxide material (e.g., silicon oxide) and nitride material (e.g., silicon nitride) can be formed.

Figure 3B:
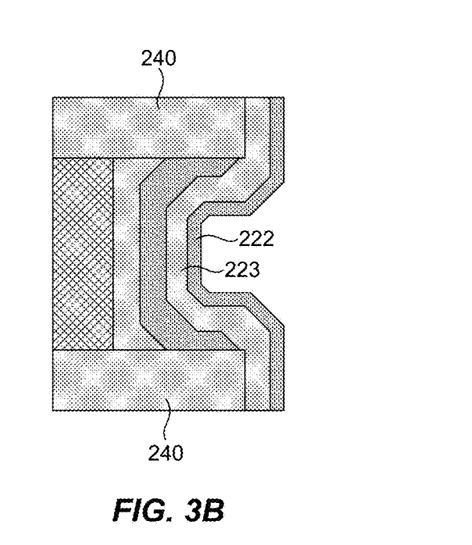

As shown in FIG. 3B, a fourth dielectric layer 222 can be formed on or adjacent to the dielectric layer 223. The dielectric layer 222 can be formed by any suitable process or technique known in the art, as described above. In one embodiment, material may be deposited to form a nitride layer 222 (e.g., silicon nitride). The dielectric layer 222 can have a thickness of from about 1 nm to about 5 nm. The dielectric layer 222 can be relatively thin compared to the other dielectric layers 223-225. For example, a ratio of a thickness of the dielectric layer 222 to a thickness of any of the other dielectric layers 223-225 (e.g., the dielectric layer 223) can be from about 1:2 to about 1:5. Despite the relatively thin dielectric layer 222, its presence may reduce the available space for the other dielectric layers 223-225. Accordingly, in one embodiment, an individual dielectric layer 223-225 or dielectric layers 223-225 in any combination may be reduced in thickness to accommodate the thickness of the dielectric layer 222. For example, the dielectric layer 223 and/or the dielectric layer 224 may be reduced in thickness by an amount that equals the thickness of the dielectric layer 222. Although four dielectric layers are shown, it should be recognized that any number of four or greater dielectric layers can be formed or included in a memory cell as disclosed herein.

Figure 3C:
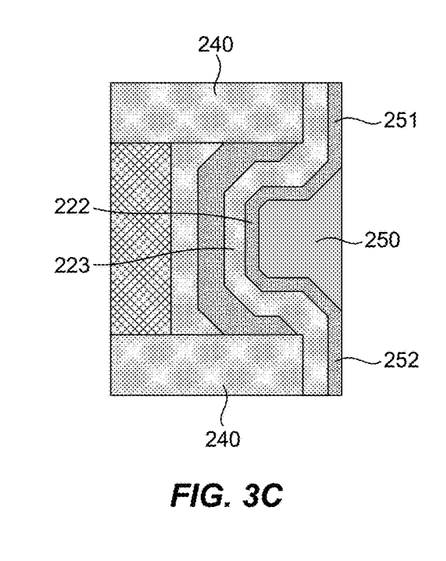
Figure 3D:
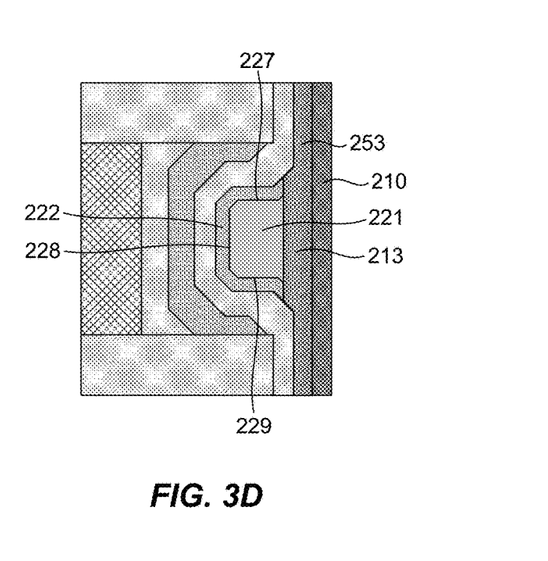

FIGS. 3B-3D may represent the process where the fourth dielectric layer 222 (i.e., the dielectric layer closest or adjacent to the charge storage structure 221) is formed of a nitride material (e.g., silicon nitride). As shown in FIG. 3C, a conductive layer 250 can then be formed on the dielectric layer 222. The conductive layer 250 can include any suitable conductive material, such as polysilicon, which can be conductively doped (e.g., to an N+ type conductivity). The conductive layer 250 material will form the final charge storage structure 221 (see FIG. 3D) adjacent to the dielectric layer 222. The conductive layer 250 can be formed by any suitable process or technique, such as a deposition process. A portion of the conductive layer 250 can be removed (e.g., by etching and/or oxidation cutting) to expose portions 251, 252 of the dielectric layer 222. The presence of the dielectric layer 222 can preserve underlying material, such as the insulative layers 240 and/or the dielectric layer 223 during removal of the portion of the conductive layer 250.

The exposed portions 251, 252 of the dielectric layer 222 and a portion of the conductive layer 250, as shown in FIG. 3C, can be oxidized to form (e.g., grow) a continuous vertical oxide layer 253, as illustrated in FIG. 3D. A portion of the conductive layer 250 material can be converted to form the tunnel dielectric layer (e.g., tunnel oxide) 213 and form the final shape of the charge storage structure 221, concurrently. The tunnel dielectric layer 213 can therefore be formed on the charge storage structure 221. Any suitable oxidation process can be utilized. The composition of the oxide material will depend on the type of material oxidized. In some embodiments, the dielectric layer 222 and the charge storage structure 221 can be configured such that the dielectric layer 222 is adjacent to at least portions of three sides 227-229 of the charge storage structure 221. Following the formation of the charge storage structure 221 and tunnel dielectric layer 213, a suitable semiconductor material (e.g., polysilicon material, Ge, SiGe, SiC, etc.) can be disposed (e.g., deposited) on the tunnel dielectric layer 213 to form a conductive channel 210. In some embodiments, the conductive channel can have a hollow interior, which can be filled with an insulative material (e.g., oxide). In one aspect, conversion of exposed dielectric layer 222 portions 251, 252 into oxide when forming the oxide layer 253 can enable the formation of a straight conductive channel 210 as well as enable scaling of the size of the conductive channel 210.

Figure 4A:
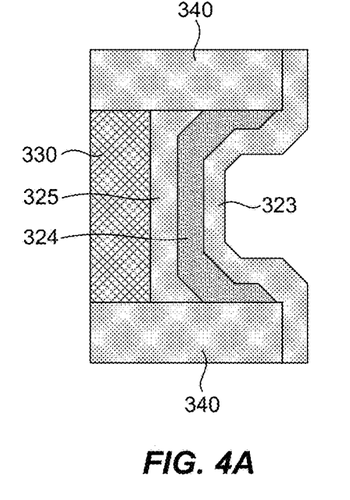
FIGS. 4A-4D illustrate methods for making a flash memory cell in accordance with another example embodiment.
Figure 4B:
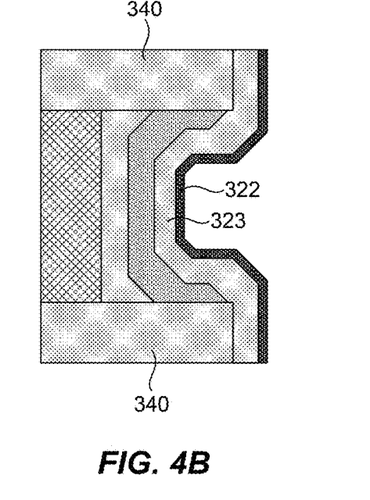
Figure 4C:
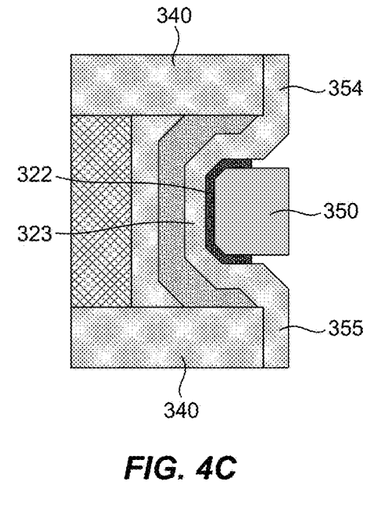
Figure 4D:
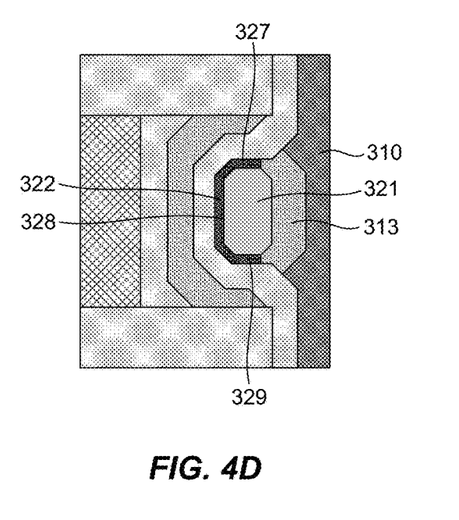

FIGS. 4A-4D illustrate aspects of other exemplary methods or processes for making a flash memory cell for inclusion in a flash memory component or device, such as the flash memory component or device 100. The process can begin similar to that described above with reference to FIG. 3A, where a control gate 330 is formed between insulative layers 340, and three dielectric layers 323-325 are formed between the insulative layers 340 on the control gate 330. In one embodiment, material may be deposited and oxidized to form an oxide layer 325 (e.g., silicon oxide), material may be deposited to form a nitride layer 324 (e.g., silicon nitride), and material may be deposited and oxidized to form an oxide layer 323 (e.g., silicon oxide). Thus, alternating layers of oxide material (e.g., silicon oxide) and nitride material (e.g., silicon nitride) can be formed. As shown in FIG. 4B, the fourth dielectric layer 322 can be formed on or adjacent to the dielectric layer 323. The dielectric layer 322 can be formed by any suitable process or technique known in the art, as described above. FIGS. 4B-4D are discussed below with respect to an embodiment where the fourth dielectric layer 322 (i.e., the dielectric layer closest or adjacent to the charge storage structure 321) is formed of an oxide material (e.g., aluminum oxide).

As shown in FIG. 4C, a conductive layer 350 can be formed on the dielectric layer 322. The conductive layer 350 can include any suitable conductive material, such as polysilicon, which can be conductively doped (e.g., to an N+ type conductivity). The conductive layer 350 material will form the final charge storage structure 321 (see FIG. 4D) adjacent to the dielectric layer 322. The conductive layer 350 can be formed by any suitable process or technique, such as a deposition process. A portion of the conductive layer 350 and the dielectric layer 322 can be removed (e.g., by etching and/or oxidation cutting) to expose portions 354, 355 of the dielectric layer 323. The presence of the dielectric layer 323 can preserve underlying material, such as the insulative layers 340 and/or the dielectric layer 324 during removal of the portion of the conductive layer 350 and the dielectric layer 322.

As illustrated in FIG. 4D, a portion of the conductive layer 350 material can be oxidized to form (e.g., grow) the tunnel dielectric layer (e.g., tunnel oxide) 313. For example, a portion of the conductive layer 350 can be converted to form the tunnel dielectric layer 313 and form the final shape of the charge storage structure 321, concurrently. The tunnel dielectric layer 313 can therefore be formed on the charge storage structure 321. Any suitable oxidation process can be utilized. The composition of the oxide material will depend on the type of material oxidized. In some embodiments, the dielectric layer 322 and the charge storage structure 321 can be configured such that the dielectric layer 322 is adjacent to at least portions of three sides 327-329 of the charge storage structure 321. Following the formation of the charge storage structure 321 and tunnel dielectric layer 313, a suitable semiconductor material (e.g., polysilicon material, Ge, SiGe, SiC, etc.) can be disposed (e.g., deposited) on the tunnel dielectric layer 313 to form a conductive channel 310. In some embodiments, the conductive channel can have a hollow interior, which can be filled with an insulative material (e.g., oxide).

Although the present disclosure is provided in the context of a NAND flash memory device (e.g., 3D NAND flash memory), it should be recognized that certain aspects of the present disclosure may also be applicable to NOR flash memory, charge trap flash memory (e.g., VNAND) or other memory utilizing floating gate metal-oxide-semiconductor field-effect transistors (FGMOSFET) as memory cells.

Figure 5:
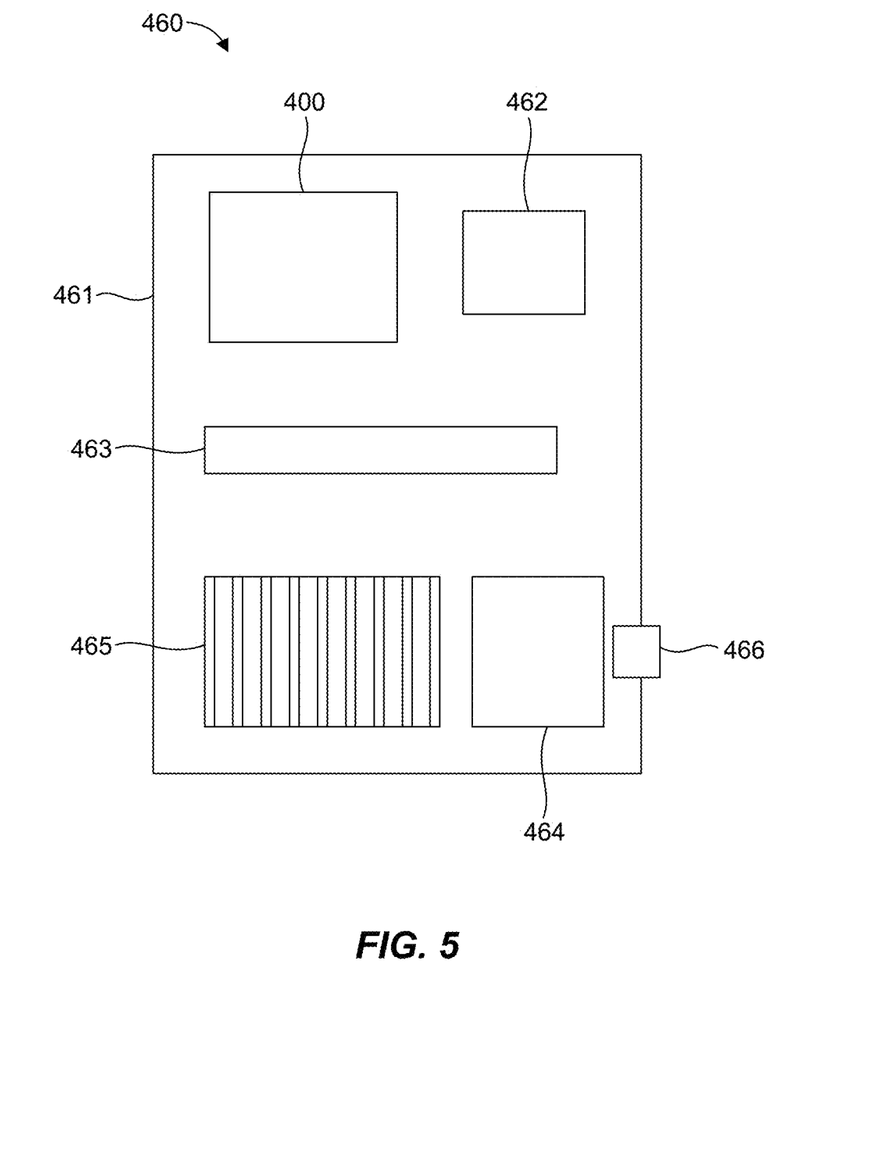
FIG. 5 is a schematic illustration of an exemplary computing system.

FIG. 5 illustrates an example computing system 460. The computing system 460 can include a memory device (e.g., flash memory) 400 as disclosed herein, coupled to a motherboard 461. In one aspect, the computing system 460 can also include a processor 462, a memory device 463, a radio 464, a heat sink 465, a port 466, a slot, or any other suitable device or component, which can be operably coupled to the motherboard 461. The computing system 460 can comprise any type of computing system, such as a desktop computer, a laptop computer, a tablet computer, a smartphone, a wearable device, a server, etc. Other embodiments need not include all of the features specified in FIG. 5, and may include alternative features not specified in FIG. 5.

Circuitry used in electronic components or devices (e.g., a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements, including such as those described herein), at least one input device, and at least one output device. Volatile and non-volatile memory and/or storage elements may be a RAM, EPROM, flash drive, optical drive, magnetic hard drive, solid state drive, or other medium for storing electronic data, including the memory disclosed herein. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

EXAMPLES

The following examples pertain to further embodiments.

In one example, there is provided a flash memory cell comprising a charge storage structure, a control gate laterally separated from the charge storage structure, and at least four dielectric layers disposed between the control gate and the charge storage structure.

In one example of a memory cell, a layer of the at least four dielectric layers is adjacent to the charge storage structure and comprises a nitride material.

In one example of a memory cell, the nitride material comprises silicon nitride.

In one example of a memory cell, a layer of the at least four dielectric layers is adjacent to the charge storage structure and comprises an oxide material.

In one example of a memory cell, the oxide material comprises aluminum oxide.

In one example of a memory cell, a layer of the at least four dielectric layers is adjacent to the charge storage structure and comprises a high dielectric constant material.

In one example of a memory cell, the high dielectric constant material comprises HfOx, HfAlOx, or a combination thereof.

In one example of a memory cell, a layer of the at least four dielectric layers is adjacent to at least portions of three sides of the charge storage structure.

In one example of a memory cell, the at least four dielectric layers comprises alternating layers of oxide material and nitride material.

In one example of a memory cell, the oxide material comprises silicon oxide.

In one example of a memory cell, the nitride material comprises silicon nitride.

In one example of a memory cell, a layer of the at least four dielectric layers is adjacent to the charge storage structure and has a thickness of from about 1 nm to about 5 nm.

In one example of a memory cell, a first layer of the at least four dielectric layers is adjacent to the charge storage structure, and a ratio of a thickness of the first layer to a thickness of a second layer of the at least four dielectric layers is from about 1:2 to about 1:5.

In one example of a memory cell, the second layer is adjacent to the first layer.

In one example of a memory cell, the at least four dielectric layers are configured to provide a program-erase window that is sufficient for operation of a quad level cell (QLC).

In one example of a memory cell, the at least four dielectric layers are configured to provide a band gap that is sufficient for operation of a quad level cell (QLC).

In one example of a memory cell, the charge storage structure is a floating gate or a charge trap.

In one example, there is provided a flash memory device comprising a plurality of insulative layers vertically spaced apart from one another, a vertically oriented conductive channel extending through the plurality of insulative layers, a charge storage structure disposed between adjacent insulative layers, a control gate laterally separated from the charge storage structure such that the charge storage structure is between the control gate and the conductive channel, and at least four dielectric layers disposed between the control gate and the charge storage structure.

In one example of a flash memory device, a layer of the at least four dielectric layers is adjacent to the charge storage structure and comprises a nitride material.

In one example of a flash memory device, the nitride material comprises silicon nitride.

In one example of a flash memory device, a layer of the at least four dielectric layers is adjacent to the charge storage structure and comprises an oxide material.

In one example of a flash memory device, the oxide material comprises aluminum oxide.

In one example of a flash memory device, a layer of the at least four dielectric layers is adjacent to the charge storage structure and comprises a high dielectric constant material.

In one example of a flash memory device, the high dielectric constant material comprises HfOx, HfAlOx, or a combination thereof.

In one example of a flash memory device, a layer of the at least four dielectric layers is adjacent to at least portions of three sides of the charge storage structure.

In one example of a flash memory device, the at least four dielectric layers comprises alternating layers of oxide material and nitride material.

In one example of a flash memory device, the oxide material comprises silicon oxide.

In one example of a flash memory device, the nitride material comprises silicon nitride.

In one example of a flash memory device, a layer of the at least four dielectric layers is adjacent to the charge storage structure and has a thickness of from about 1 nm to about 5 nm.

In one example of a flash memory device, a first layer of the at least four dielectric layers is adjacent to the charge storage structure, and a ratio of a thickness of the first layer to a thickness of a second layer of the at least four dielectric layers is from about 1:2 to about 1:5.

In one example of a flash memory device, the second layer is adjacent to the first layer.

In one example of a flash memory device, the at least four dielectric layers are configured to provide a program-erase window that is sufficient for operation of a quad level cell (QLC).

In one example of a flash memory device, the at least four dielectric layers are configured to provide a band gap that is sufficient for operation of a quad level cell (QLC).

In one example of a flash memory device, the charge storage structure is a floating gate or a charge trap.

In one example, a flash memory device comprises a tunnel dielectric layer disposed between the charge storage structure and the conductive channel.

In one example of a flash memory device, the plurality of insulative layers comprises an oxide material, an oxynitride material, a nitride material, or a combination thereof.

In one example of a flash memory device, the conductive channel comprises a polysilicon material, Ge, SiGe, SiC, or a combination thereof.

In one example, there is provided a computing system comprising a motherboard, and a flash memory device operably coupled to the motherboard. The flash memory device comprises a plurality of insulative layers vertically spaced apart from one another, a vertically oriented conductive channel extending through the plurality of insulative layers, a charge storage structure disposed between adjacent insulative layers, a control gate laterally separated from the charge storage structure such that the charge storage structure is between the control gate and the conductive channel, and at least four dielectric layers disposed between the control gate and the charge storage structure.

In one example of a computing system, the computing system comprises a desktop computer, a laptop computer, a tablet computer, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example, there is provided a method for making a flash memory device comprising forming at least four dielectric layers between adjacent, vertically spaced apart insulative layers, wherein a first layer of the at least four dielectric layers is adjacent to a control gate between the insulative layers, and forming a charge storage structure adjacent to a second layer of the at least four dielectric layers, such that the charge storage structure is laterally separated from the control gate and the at least four dielectric layers are between the control gate and the charge storage structure.

In one example of a method for making a flash memory device, the second layer of the at least four dielectric layers comprises a nitride material.

In one example of a method for making a flash memory device, the nitride material comprises silicon nitride.

In one example of a method for making a flash memory device, the second layer is formed by depositing the nitride material.

In one example of a method for making a flash memory device, the second layer of the at least four dielectric layers comprises an oxide material.

In one example of a method for making a flash memory device, the oxide material comprises aluminum oxide.

In one example of a method for making a flash memory device, the second layer is formed by depositing the oxide material.

In one example of a method for making a flash memory device, the second layer of the at least four dielectric layers comprises a high dielectric constant material.

In one example of a method for making a flash memory device, the high dielectric constant material comprises HfOx, HfAlOx, or a combination thereof.

In one example of a method for making a flash memory device, the second layer is formed by depositing the high dielectric constant material.

In one example of a method for making a flash memory device, the second layer is adjacent to at least portions of three sides of the charge storage structure.

In one example of a method for making a flash memory device, the at least four dielectric layers comprises alternating layers of oxide material and nitride material.

In one example of a method for making a flash memory device, the oxide material comprises silicon oxide.

In one example of a method for making a flash memory device, the nitride material comprises silicon nitride.

In one example of a method for making a flash memory device, the second layer of the at least four dielectric layers has a thickness of from about 1 nm to about 5 nm.

In one example of a method for making a flash memory device, a ratio of a thickness of the second layer to a thickness of a third layer of the at least four dielectric layers is from about 1:2 to about 1:5.

In one example of a method for making a flash memory device, the third layer is adjacent to the second layer.

In one example of a method for making a flash memory device, the at least four dielectric layers are configured to provide a program-erase window that is sufficient for operation of a quad level cell (QLC).

In one example of a method for making a flash memory device, the at least four dielectric layers are configured to provide a band gap that is sufficient for operation of a quad level cell (QLC).

In one example of a method for making a flash memory device, the charge storage structure is a floating gate or a charge trap.

In one example of a method for making a flash memory device, the insulative layers comprise an oxide material, an oxynitride material, a nitride material, or a combination thereof.

In one example, a method for making a flash memory device comprises forming a tunnel dielectric layer on the charge storage structure.

In one example, a method for making a flash memory device comprises forming a conductive channel on the tunnel dielectric layer.

In one example of a method for making a flash memory device, the conductive channel comprises a polysilicon material, Ge, SiGe, SiC, or a combination thereof.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A flash memory device, comprising:
   a plurality of insulative layers vertically spaced apart from one another;
   a vertically oriented conductive channel extending through the plurality of insulative layers;
   a charge storage structure disposed between individual adjacent insulative layers;
   a control gate laterally separated from the charge storage structure such that the charge storage structure is between the control gate and the conductive channel; and
   at least four dielectric layers disposed between the control gate and the charge storage structure.

2. The flash memory device of claim 1, wherein a layer of the at least four dielectric layers is adjacent to the charge storage structure and comprises a nitride material.

3. The flash memory device of claim 2, wherein the nitride material comprises silicon nitride.

4. The flash memory device of claim 1, wherein a layer of the at least four dielectric layers is adjacent to the charge storage structure and comprises an oxide material.

5. The flash memory device of claim 4, wherein the oxide material comprises aluminum oxide.

6. The flash memory device of claim 1, wherein a layer of the at least four dielectric layers is adjacent to the charge storage structure and comprises a high dielectric constant material.

7. The flash memory device of claim 6, wherein the high dielectric constant material comprises HfOx, HfAlOx, or a combination thereof.

8. The flash memory device of claim 1, wherein a layer of the at least four dielectric layers is adjacent to at least portions of three sides of the charge storage structure.

9. The flash memory device of claim 1, wherein the at least four dielectric layers comprises alternating layers of oxide material and nitride material.

10. The flash memory device of claim 9, wherein the oxide material comprises silicon oxide.

11. The flash memory device of claim 9, wherein the nitride material comprises silicon nitride.

12. The flash memory device of claim 1, wherein a layer of the at least four dielectric layers is adjacent to the charge storage structure and has a thickness of from about 1 nm to about 5 nm.

13. The flash memory device of claim 1, wherein a first layer of the at least four dielectric layers is adjacent to the charge storage structure, and a ratio of a thickness of the first layer to a thickness of a second layer of the at least four dielectric layers is from about 1:2 to about 1:5.

14. The flash memory device of claim 13, wherein the second layer is adjacent to the first layer.

15. The flash memory device of claim 1, wherein the at least four dielectric layers are configured to provide a program-erase window that is sufficient for operation of a quad level cell (QLC).

16. The flash memory device of claim 1, wherein the at least four dielectric layers are configured to provide a band gap that is sufficient for operation of a quad level cell (QLC).

17. The flash memory device of claim 1, wherein the charge storage structure is a floating gate or a charge trap.

18. The flash memory device of claim 1, further comprising a tunnel dielectric layer disposed between the charge storage structure and the conductive channel.

19. The flash memory device of claim 1, wherein the plurality of insulative layers comprises an oxide material, an oxynitride material, a nitride material, or a combination thereof.

20. The flash memory device of claim 1, wherein the conductive channel comprises a polysilicon material, Ge, SiGe, SiC, or a combination thereof.

* * * * *